US012324329B2

(12) United States Patent
Jo et al.

(10) Patent No.: US 12,324,329 B2
(45) Date of Patent: Jun. 3, 2025

(54) REPAIR CIRCUIT FOR A DISPLAY DEVICE

(71) Applicant: Samsung Display Co., LTD., Yongin-si (KR)

(72) Inventors: Yongjun Jo, Hwaseong-si (KR); Kwang-Chul Jung, Seoul (KR); Mina Kim, Suwon-si (KR); Seulbee Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 564 days.

(21) Appl. No.: 17/687,135

(22) Filed: Mar. 4, 2022

(65) Prior Publication Data
US 2022/0293695 A1    Sep. 15, 2022

(30) Foreign Application Priority Data

Mar. 10, 2021  (KR) .................. 10-2021-0031639

(51) Int. Cl.
*H10K 59/131* (2023.01)
*G09G 3/32* (2016.01)
*H10K 59/88* (2023.01)

(52) U.S. Cl.
CPC ............. *H10K 59/131* (2023.02); *G09G 3/32* (2013.01); *H10K 59/88* (2023.02); *G09G 2310/0267* (2013.01); *G09G 2330/08* (2013.01); *G09G 2330/10* (2013.01)

(58) Field of Classification Search
CPC .... H10K 59/88; H10K 59/131; H10K 71/861; G09G 3/32; G09G 2330/08; G09G 2330/10
See application file for complete search history.

(56) References Cited

U.S. PATENT DOCUMENTS

| 10,451,942 | B2 | 10/2019 | Yu et al. | |
| 10,483,332 | B2 | 11/2019 | Kang et al. | |
| 11,164,514 | B2* | 11/2021 | Cho | G09G 3/3208 |
| 11,355,071 | B2* | 6/2022 | Kim | G09G 3/3266 |
| 11,716,885 | B2* | 8/2023 | Lee | H10K 59/131 |
| | | | | 257/773 |
| 12,039,936 | B2* | 7/2024 | Kang | G09G 3/3233 |
| 2016/0335950 | A1* | 11/2016 | Kang | G09G 3/2085 |
| 2017/0062544 | A1* | 3/2017 | Kang | H10K 59/131 |

(Continued)

FOREIGN PATENT DOCUMENTS

| KR | 10-2015-0044336 A1 | 4/2015 |
| KR | 10-2017-0092726 A1 | 8/2017 |

OTHER PUBLICATIONS

Korean Office Action for KR Application 10-2021-0031639, dated Dec. 10, 2024, 9 pages.

*Primary Examiner* — Alonzo Chambliss
(74) *Attorney, Agent, or Firm* — Womble Bond Dickinson (US) LLP

(57) ABSTRACT

A display device may include a pixel circuit in a display area including a rounded corner portion, a scan driving circuit in a peripheral area surrounding the display area, and configured to provide a scan signal to the pixel circuit, a fan-out line between the pixel circuit and the scan driving circuit in the peripheral area adjacent to the corner portion, and configured to provide a pixel data signal to the pixel circuit, and a repair circuit between the scan driving circuit and the fan-out line in the peripheral area adjacent to the corner portion.

21 Claims, 18 Drawing Sheets

(56) References Cited

U.S. PATENT DOCUMENTS

2017/0337873 A1* 11/2017 Kim ................... G09G 3/3233
2018/0006105 A1*  1/2018 Kim ................... G09G 3/3225
2021/0043134 A1   2/2021 Cho et al.

* cited by examiner

REPAIR CIRCUIT FOR A DISPLAY DEVICE

CROSS-REFERENCE TO RELATED APPLICATION

This application claims priority to, and the benefit of, Korean Patent Application No. 10-2021-0031639 filed on Mar. 10, 2021 in the Korean Intellectual Property Office (KIPO), the entire disclosure of which is incorporated by reference herein.

BACKGROUND

1. Field

Embodiments relate to a display device applicable to various electronic devices.

2. Description of the Related Art

A display device may include a plurality of pixels. Each of the pixels may be a basic unit for displaying one color. Accordingly, the display device may display a full color image through the pixels.

The pixel may include a pixel circuit for generating a driving current and a light emitting element. To generate the driving current, the pixel circuit may include a plurality of transistors and at least one capacitor. The light emitting element may emit light based on the driving current transmitted from the pixel circuit.

Because the structure of the pixel circuit is complicated, and because the manufacturing process of the pixel circuit is difficult, defects of the pixel circuit may occur during the manufacturing process of the display device. Accordingly, the display device may include a repair circuit capable of providing the driving current to the light emitting element instead of a defective pixel circuit to improve the yield and quality of the display device.

SUMMARY

Embodiments provide a display device in which a repair data line for providing a repair data signal to a repair circuit is separated from a pixel data line for providing a pixel data signal to a pixel circuit.

A display device according to some embodiments may include a pixel circuit in a display area including a rounded corner portion, a scan driving circuit in a peripheral area surrounding the display area, and configured to provide a scan signal to the pixel circuit, a fan-out line between the pixel circuit and the scan driving circuit in the peripheral area adjacent to the corner portion, and configured to provide a pixel data signal to the pixel circuit, and a repair circuit between the scan driving circuit and the fan-out line in the peripheral area adjacent to the corner portion.

The pixel circuit may include an active layer, a first conductive layer above the active layer, a second conductive layer above the first conductive layer, a third conductive layer above the second conductive layer, and a fourth conductive layer above the third conductive layer.

The display device may further include a pixel data line in the display area, connected to the fan-out line, and configured to provide the pixel data signal to the pixel circuit, and a repair data line in the peripheral area, and configured to provide a repair data signal to the repair circuit.

The repair data line may be at a same layer as the pixel data line.

The pixel data line and the repair data line may be at a same layer as the fourth conductive layer.

The repair data line may have a curved shape in the peripheral area adjacent to the corner portion.

The display device may further include a connection line connecting the scan driving circuit and the pixel circuit, and configured to provide the scan signal to the pixel circuit.

The connection line may cross the fan-out line, and is at a different layer from the fan-out line in the peripheral area adjacent to the corner portion.

The connection line may be at a same layer as the third conductive layer.

The fan-out line may be at a same layer as one of the first conductive layer and the second conductive layer.

A display device according to some embodiments may include pixel circuits in a display area including a rounded first corner portion and a rounded second corner portion, the pixel circuits being arranged in a first direction, and in a second direction that is substantially perpendicular to the first direction, scan driving circuits in a peripheral area surrounding the display area, and configured to provide scan signals to the pixel circuits, first repair circuits adjacent to the scan driving circuits in the peripheral area adjacent to the first corner portion, the first repair circuits being arranged in a third direction that is between the first direction and the second direction, second repair circuits in the peripheral area adjacent to the second corner portion, pixel data lines in the display area, and configured to provide pixel data signals to the pixel circuits, and a repair data line in the peripheral area, and configured to provide a repair data signal to the first repair circuits and the second repair circuits.

The second repair circuits may be adjacent to the scan driving circuits and spaced apart from the pixel circuits.

The repair data line may have a curved shape in the peripheral area adjacent to the first corner portion and the second corner portion.

The second repair circuits may be adjacent to the pixel circuits and spaced apart from the scan driving circuits.

The repair data line may have a curved shape in the peripheral area adjacent to the first corner portion, and has a stepped shape extending in the first direction and in the second direction in the peripheral area adjacent to the second corner portion.

The repair data line may include branch repair data lines crossing the second repair circuits in the peripheral area adjacent to the second corner portion, and wherein the branch repair data lines are at a same lines as the pixel data lines and spaced apart from the pixel data lines.

The display device may further include fan-out lines between the pixel circuits and the scan driving circuits in the peripheral area adjacent to the first corner portion, the fan-out lines being respectively connected to the pixel data lines.

The first repair circuits may be between the scan driving circuits and the fan-out lines.

The display device may further include connection lines connecting the scan driving circuits and the pixel circuits, and configured to provide the scan signals to the pixel circuits.

The connection lines may cross the fan-out lines and are at a different layer from the fan-out lines in the peripheral area adjacent to the first corner portion.

The connection lines may be at a same layer as the fan-out lines in the peripheral area adjacent to the second corner portion.

In the display device according to some embodiments, the repair circuit may be located between the scan driving circuit and the fan-out line in the peripheral area adjacent to the rounded corner portion, so that the repair circuit may be spaced apart from the pixel circuit with the fan-out line interposed therebetween. Accordingly, the repair data line of the repair circuit may be separated from the pixel data line of the pixel circuit, and the defective pixel may be easily repaired.

BRIEF DESCRIPTION OF THE DRAWINGS

Illustrative, non-limiting embodiments will be more clearly understood from the following detailed description taken in conjunction with the accompanying drawings.

DETAILED DESCRIPTION

Figure 1:
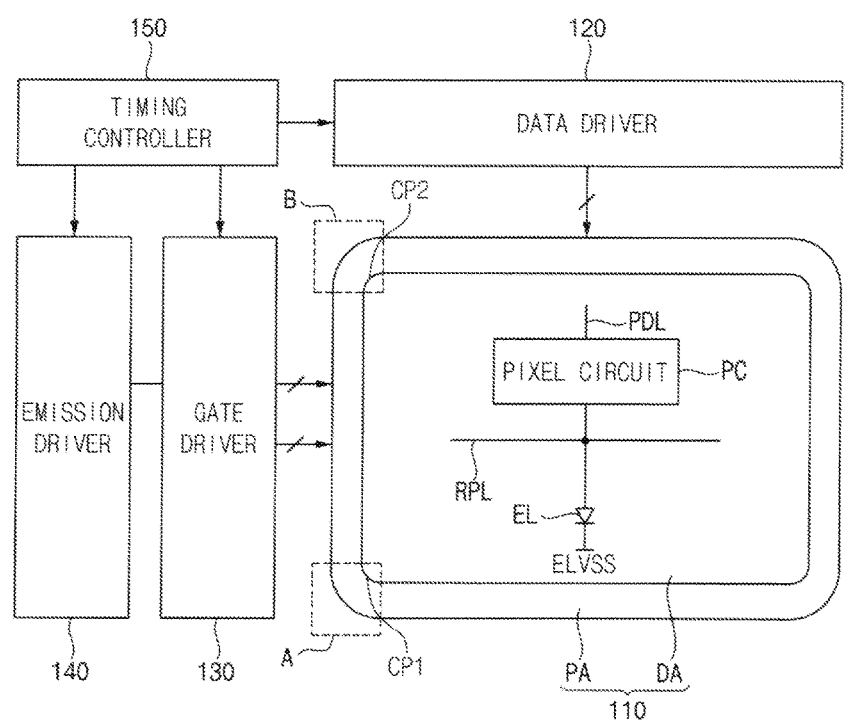
FIG. 1 is a block diagram illustrating a display device according to some embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure.

Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a block diagram illustrating a display device according to some embodiments.

Referring to FIG. 1, a display device may include a display panel 110, a data driver 120, a gate driver 130, an emission driver 140, and a timing controller 150.

The display panel 110 may include a display area DA and a peripheral area PA. The display area DA may display an image. Pixels may be located in the display area DA. Each of the pixels may include a pixel circuit PC and a light emitting element EL. The pixel circuit PC may receive a pixel data signal from a pixel data line PDL. An electrode (e.g., an anode electrode) of the light emitting element EL may be connected to the pixel circuit PC, and another electrode (e.g., a cathode electrode) of the light emitting element EL may be connected to a line providing a common voltage ELVSS. The pixel circuit PC may provide a driving current to the light emitting element EL based on the pixel data signal, and the light emitting element EL may emit light in response to the driving current.

The display area DA may include at least one rounded corner portion. In some embodiments, the display area DA may include a rounded first corner portion CP1 and a rounded second corner portion CP2. For example, the first corner portion CP1 may be a lower corner portion of the display area DA, and the second corner portion CP2 may be an upper corner portion of the display area DA.

The data driver 120 may provide the pixel data signal to the pixel circuit PC. The gate driver 130 may provide a gate signal to the pixel circuit PC. In some embodiments, the gate signal may include a write gate signal, an initialization gate signal, and a bypass gate signal. The emission driver 140 may provide an emission control signal to the pixel circuit PC. The timing controller 150 may control the data driver 120, the gate driver 130, and the emission driver 140. The gate driver 130 and the emission driver 140 may be located in the peripheral area PA of the display panel 110. In some embodiments, the data driver 120 and/or the timing controller 150 may be located in the peripheral area PA of the display panel 110.

Figure 2:
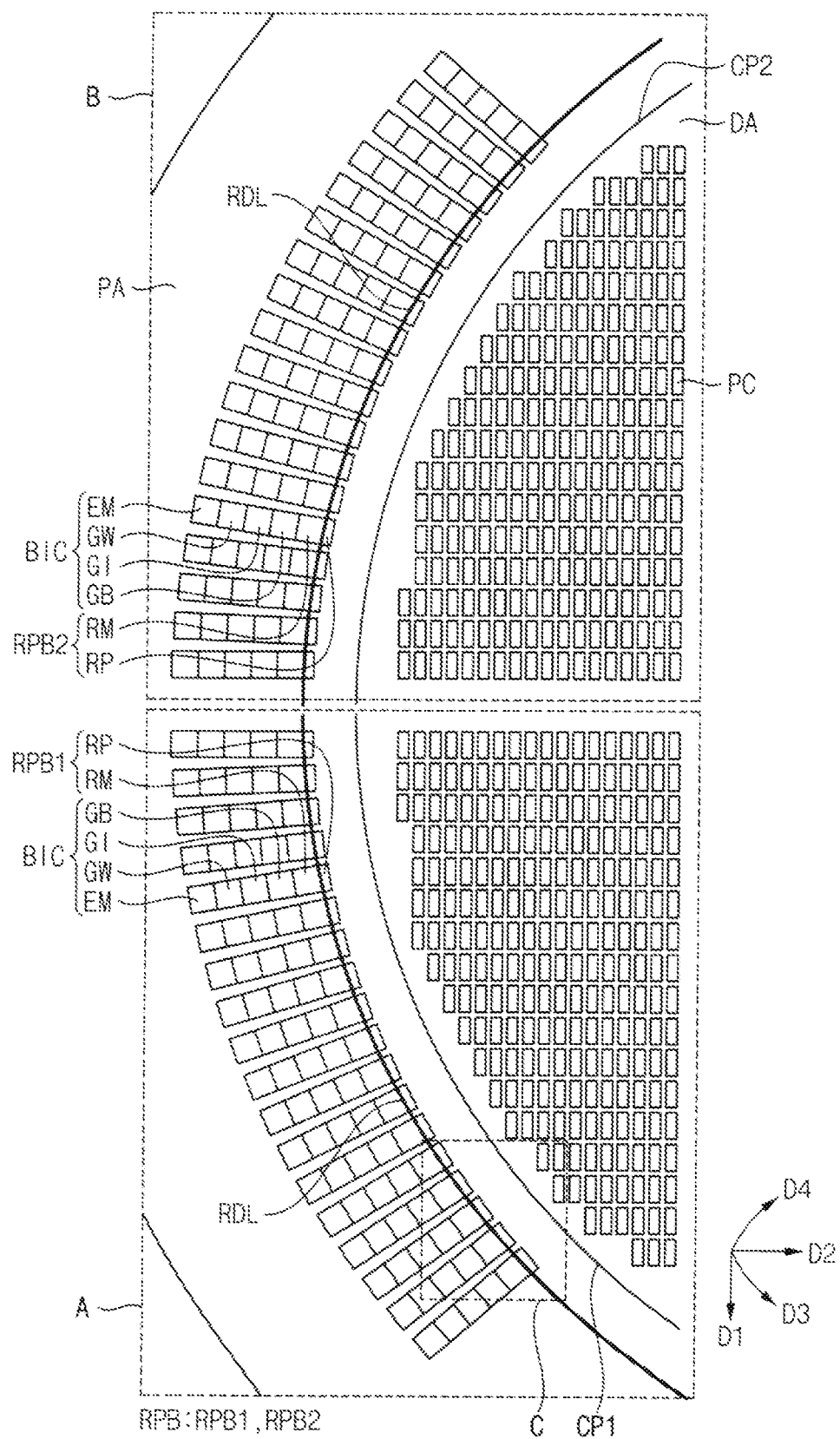
FIG. 2 is a plan view illustrating some embodiments of an area A and an area B in FIG. 1.
Figure 3:
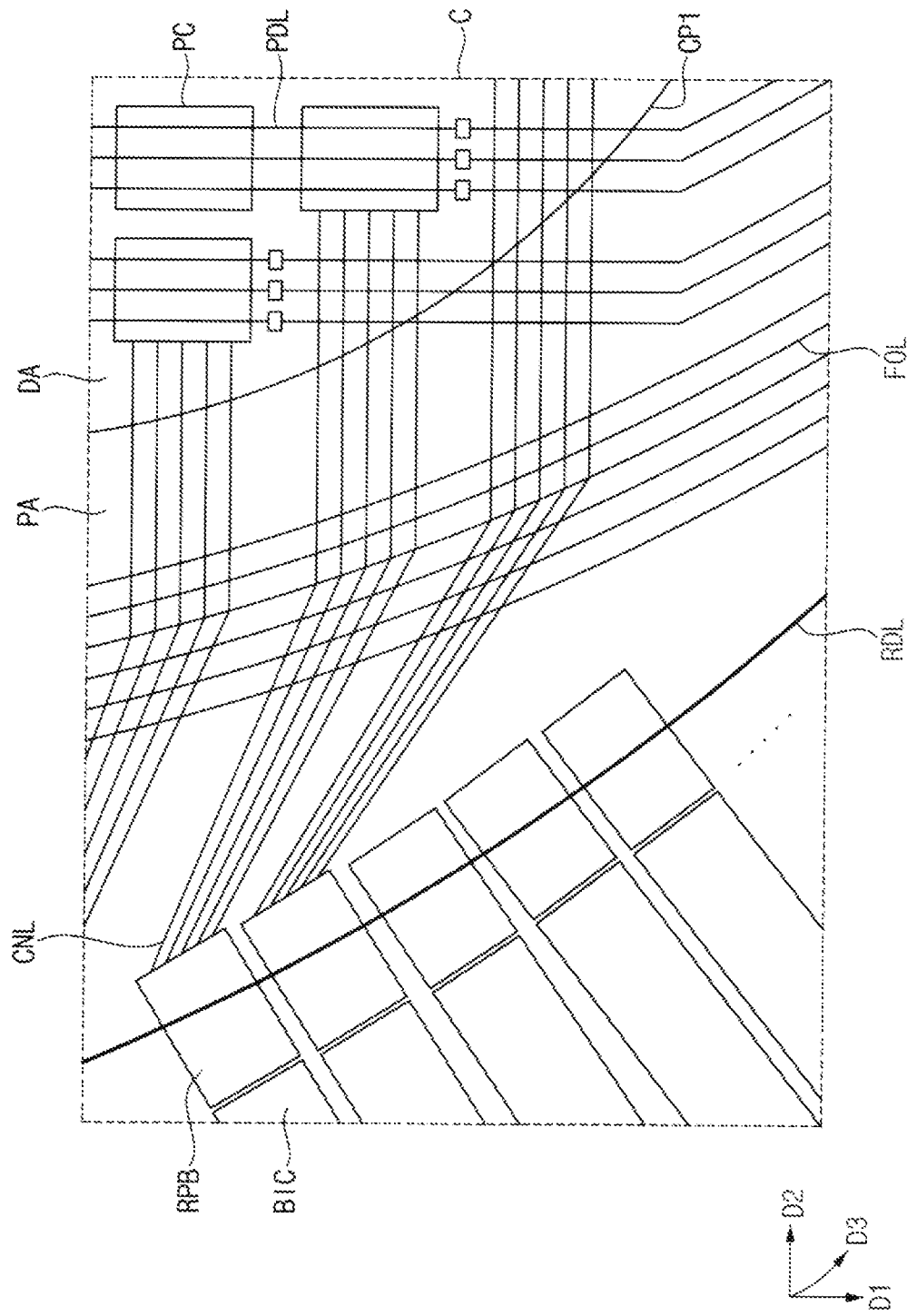
FIG. 3 is a plan view illustrating an area C in FIG. 2.

FIG. 2 is a plan view illustrating some embodiments of an area A and an area B in FIG. 1. For example, the area A may illustrate portions of the display area DA and the peripheral area PA that are adjacent to the first corner portion CP1, and the area B may illustrate portions of the display area DA and the peripheral area PA that are adjacent to the second corner portion CP2. FIG. 3 is a plan view illustrating an area C in FIG. 2.

Referring to FIGS. 1, 2, and 3, the display device may include the pixel circuits PC, scan driving circuits BIC, fan-out lines FOL, connection lines CNL, repair circuits RPB, pixel data lines PDL, and a repair data line RDL.

The pixel circuits PC may be arranged in a first direction D1, and in a second direction D2 perpendicular to the first direction D1, in the display area DA. For example, the first direction D1 may be a column direction, and the second direction D2 may be a row direction. The pixel circuits PC located in the display area DA adjacent to the first corner portion CP1 and the second corner portion CP2 may be arranged in a stepped shape along the rounded first corner portion CP1 and the rounded second corner portion CP2.

The scan driving circuits BIC may be located in the peripheral area PA. The scan driving circuits BIC located in the peripheral area PA adjacent to the first corner portion CP1 may be arranged in a third direction D3 between the first direction D1 and the second direction D2. For example, the third direction D3 may be a direction in which the rounded first corner portion CP1 extends (e.g., generally). The scan driving circuits BIC located in the peripheral area PA adjacent to the second corner portion CP2 may be arranged in a fourth direction D4 that is generally symmetrical to the third direction D3 with respect to the second direction D2. For example, the fourth direction D4 may be a direction in which the rounded second corner portion CP2 extends (e.g., generally).

The scan driving circuits BIC may provide scan signals to the pixel circuits PC. For example, the scan signals may include the gate signal and the emission control signal. Each of the scan driving circuits BIC may include a write gate circuit GW, an initialization gate circuit GI, a bypass gate circuit GB, and an emission control circuit EM. The write gate circuit GW may generate the write gate signal, the initialization gate circuit GI may generate the initialization gate signal, and the bypass gate circuit GB may generate the bypass gate signal. Accordingly, the gate driver 130 may include the write gate circuit GW, the initialization gate circuit GI, and the bypass gate circuit GB. The emission control circuit EM may generate the emission control signal. Accordingly, the emission driver 140 may include the emission control circuit EM.

The fan-out lines FOL may be located in the peripheral area PA. The fan-out lines FOL may extend from a lower portion of the peripheral area PA to a portion of the peripheral area PA adjacent to the first corner portion CP1, and may extend into the display area DA along the first direction D1 to be connected to corresponding pixel circuits PC. The fan-out lines FOL may be located between the pixel circuits PC and the scan driving circuits BIC in the peripheral area PA adjacent to the first corner portion CP1. The fan-out lines FOL may provide the pixel data signal to the pixel circuits PC.

The connection lines CNL may connect the scan driving circuits BIC and the pixel circuits PC. The connection lines CNL may provide the scan signals generated by the scan driving circuits BIC to the pixel circuits PC.

The connection lines CNL may cross the fan-out lines FOL in the peripheral area PA adjacent to the first corner portion CP1. The connection lines CNL may be located at a different layer from the fan-out lines FOL in the peripheral area PA adjacent to the first corner portion CP1.

The repair circuits RPB may be located in the peripheral area PA. The repair circuits RPB may include first repair circuits RPB1 located in the peripheral area PA adjacent to the first corner portion CP1, and second repair circuits RPB2 located in the peripheral area PA adjacent to the second corner portion CP2.

The first repair circuits RPB1 may be adjacent to the scan driving circuits BIC, and may be spaced apart from the pixel circuits PC. In other words, an interval between the first repair circuits RPB1 and the scan driving circuits BIC may be less than an interval between the first repair circuits RPB1 and the pixel circuits PC. The first repair circuits RPB1 may be arranged in the third direction D3.

The first repair circuits RPB1 may be located between the scan driving circuits BIC and the fan-out lines FOL. The first repair circuits RPB1 may be spaced apart from the pixel circuits PC with the fan-out lines FOL interposed therebetween, and may be located closer to the scan driving circuits BIC than the fan-out lines FOL.

The second repair circuits RPB2 may be adjacent to the scan driving circuits BIC, and may be spaced apart from the pixel circuits PC. In other words, an interval between the second repair circuits RPB2 and the scan driving circuits BIC may be less than an interval between the second repair circuits RPB2 and the pixel circuits PC. The second repair circuits RPB2 may be arranged in the fourth direction D4.

The repair circuits RPB may provide the driving current to the light emitting element EL instead of a defective pixel circuit PC. Each of the repair circuits RPB may include a repair pixel circuit RP and a repair modulation circuit RM.

When a defect, such as a short circuit, a crack, or the like, occurs in some of the pixel circuits PC during a manufacturing process of the display device, a defective pixel circuit PC might not normally operate, and thus, a light emitting element EL connected to the defective pixel circuit PC might not emit light with a desired luminance. In this case, a connection between the defective pixel circuit PC and the light emitting element EL may be cut using, for example, laser cutting, etc., and the light emitting element EL and a repair line RPL may be connected with, for example, laser irradiation, etc., so that the repair pixel circuit RP other than the defective pixel circuit PC may be connected to the light emitting element EL through the repair line RPL. Accordingly, the normally operating repair pixel circuit RP may provide a driving current to the light emitting element EL through the repair line RPL, so that the light emitting element EL may emit light with a desired luminance.

The pixel data lines PDL may be located in the display area DA. The pixel data lines PDL may provide the pixel data signal to the pixel circuits PC. The pixel data lines PDL may be respectively connected to the fan-out lines FOL. Accordingly, the pixel data lines PDL may provide the pixel data signal received from the fan-out lines FOL to the pixel circuits PC.

The pixel data lines PDL may have a linear shape. For example, the pixel data lines PDL may extend in the first direction D1.

The repair data line RDL may be located in the peripheral area PA. The repair data line RDL may provide a repair data signal to the repair circuits RPB.

The repair data line RDL may have a curved shape in the peripheral area PA adjacent to the first corner portion CP1 and the second corner portion CP2. For example, the repair data line RDL may extend in the third direction D3 and in the fourth direction D4.

In some embodiments, the repair data line RDL may be located at the same layer as the pixel data lines PDL. However, the present disclosure is not limited thereto, and in other embodiments, the repair data line RDL may be located at a different layer from the pixel data lines PDL.

In a comparative display device, when repair circuits are located adjacent to the pixel circuits PC, first repair circuits located in the peripheral area PA adjacent to the first corner portion CP1 may be located in the same column as the pixel circuit PC (e.g., on a same line in the first direction D1). In this case, the first repair circuit and the pixel circuit PC located in the same column may share the pixel data line PDL, and accordingly, the repair data signal might not be provided to the first repair circuit.

However, in the display device according to some embodiments, when the first repair circuits RPB1 located in the peripheral area PA adjacent to the first corner portion CP1 are located adjacent to the scan driving circuits BIC and spaced apart from the pixel circuits PC (when the first repair circuits RPB1 are located between the scan driving circuits BIC and the fan-out lines FOL), the pixel data lines PDL providing the pixel data signal to the pixel circuits PC may be separated from the repair data line RDL for providing the repair data signal to the first repair circuits RPB1. Accordingly, the repair data signal may be provided to the first repair circuit RPB1.

Figure 4:
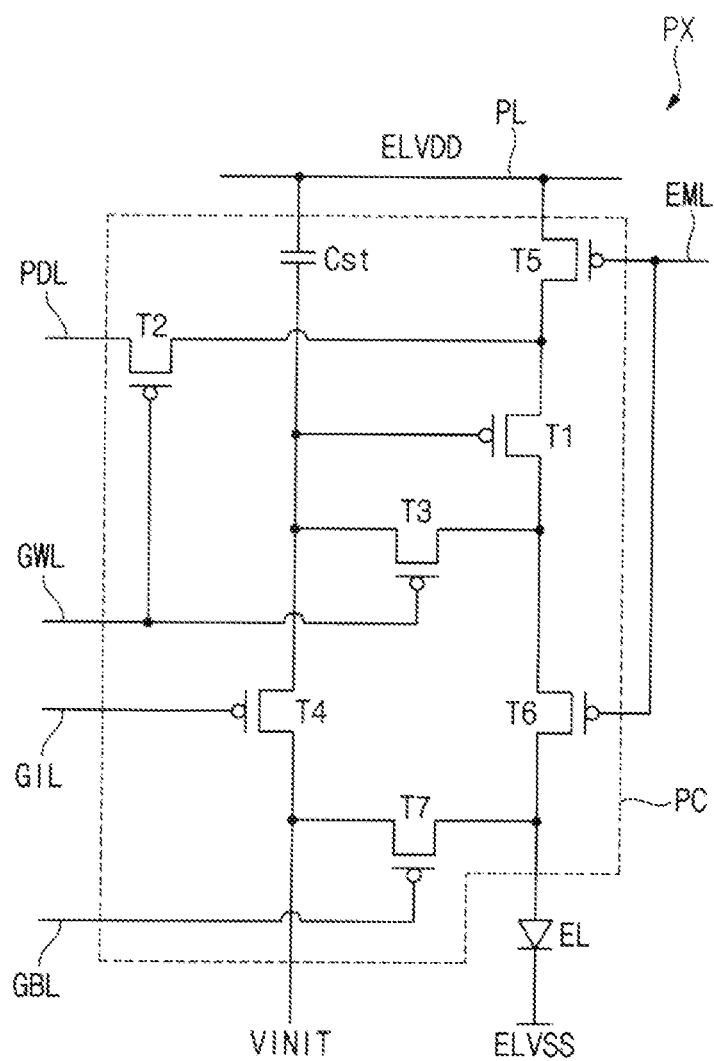
FIG. 4 is a circuit diagram illustrating a pixel including a pixel circuit in FIG. 3.
Figure 5:
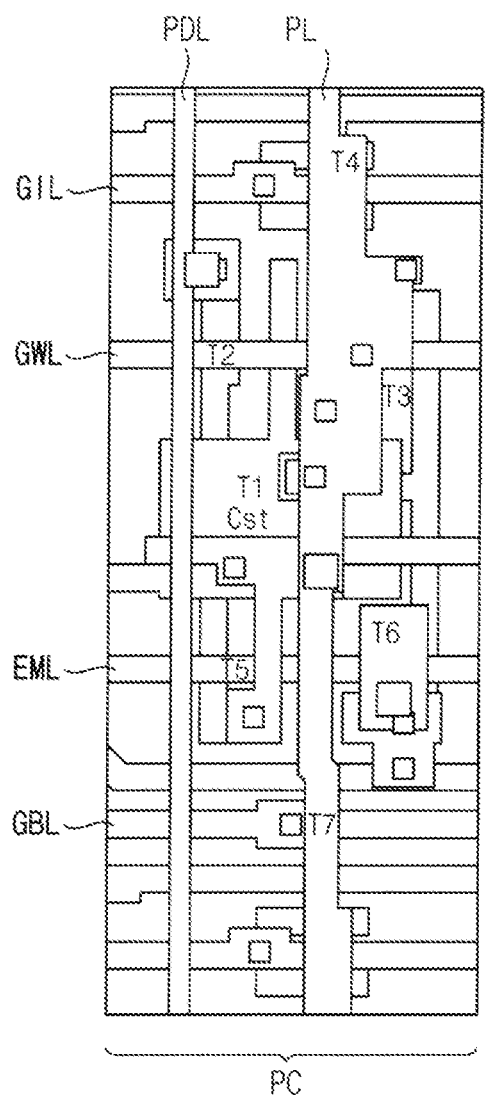
FIG. 5 is a plan view illustrating the pixel circuit in FIG. 4.

FIG. 4 is a circuit diagram illustrating the pixel PX including the pixel circuit PC in FIG. 3. FIG. 5 is a plan view illustrating the pixel circuit PC in FIG. 4.

Referring to FIGS. 4 and 5, the pixel PX may include the pixel circuit PC and the light emitting element EL. The pixel circuit PC may be connected to the pixel data line PDL, a power line PL, gate lines GWL, GIL, and GBL, an emission control line EML, and a line transmitting an initialization voltage VINIT. The light emitting element EL may be connected to the pixel circuit PC and to a line transmitting the common voltage ELVSS. The pixel circuit PC may include first to seventh transistors T1 to T7 and a storage capacitor Cst. Each of the first to seventh transistors T1 to T7 may have a gate electrode, a source electrode, and a drain electrode. The light emitting element EL may have an anode electrode and a cathode electrode.

The pixel data line PDL and the power line PL may extend in the first direction D1. The pixel data line PDL may transmit the pixel data signal, and the power line PL may transmit a driving voltage ELVDD.

The gate lines GWL, GIL, and GBL may extend in the second direction D2. The gate lines GWL, GIL, and GBL may include a write gate line GWL, an initialization gate line GIL, and a bypass gate line GBL. The write gate line GWL may transmit the write gate signal, the initialization gate line GIL may transmit the initialization gate signal, and the bypass gate line GBL may transmit the bypass gate signal.

The emission control line EML may extend in the second direction D2. The emission control line EML may transmit the emission control signal.

The first transistor T1 may generate the driving current based on the pixel data signal and the driving voltage ELVDD. The first transistor T1 may be referred to as a driving transistor.

A gate electrode of the second transistor T2 may be connected to the write gate line GWL. A source electrode of the second transistor T2 may be connected to the pixel data line PDL, and a drain electrode of the second transistor T2 may be connected to a source electrode of the first transistor T1. The second transistor T2 may transmit the pixel data signal transmitted from the pixel data line PDL to the first transistor T1 in response to the write gate signal transmitted from the write gate line GWL. The second transistor T2 may be referred to as a write transistor.

A gate electrode of the third transistor T3 may be connected to the write gate line GWL. A source electrode of the third transistor T3 may be connected to a drain electrode of the first transistor T1, and a drain electrode of the third transistor T3 may be connected to a gate electrode of the first transistor T1. The third transistor T3 may diode-connect the drain electrode and the gate electrode of the first transistor T1 in response to the write gate signal transmitted from the write gate line GWL. The third transistor T3 may be referred to as a compensation transistor.

A gate electrode of the fourth transistor T4 may be connected to the initialization gate line GIL. A source electrode of the fourth transistor T4 may receive the initialization voltage VINIT, and a drain electrode of the fourth transistor T4 may be connected to the gate electrode of the first transistor T1. The fourth transistor T4 may transmit the initialization voltage VINIT to the first transistor T1 in response to the initialization gate signal transmitted from the initialization gate line GIL. The fourth transistor T4 may be referred to as an initialization transistor.

A gate electrode of the fifth transistor T5 may be connected to the emission control line EML. A source electrode of the fifth transistor T5 may receive the driving voltage ELVDD, and a drain electrode of the fifth transistor T5 may be connected to the source electrode of the first transistor T1.

A gate electrode of the sixth transistor T6 may be connected to the emission control line EML. A source electrode of the sixth transistor T6 may be connected to the drain electrode of the first transistor T1, and a drain electrode of the sixth transistor T6 may be connected to the anode electrode of the light emitting element EL.

Each of the fifth and sixth transistors T5 and T6 may connect the first transistor T1 to the driving voltage ELVDD and to the light emitting element EL in response to the emission control signal transmitted from the emission control line EML. Each of the fifth transistor T5 and the sixth transistor T6 may be referred to as an emission control transistor.

A gate electrode of the seventh transistor T7 may be connected to the bypass gate line GBL. A source electrode of the seventh transistor T7 may receive the initialization voltage VINIT, and a drain electrode of the seventh transistor T7 may be connected to the anode electrode of the light emitting element EL. The seventh transistor T7 may transmit the initialization voltage VINIT to the light emitting element EL in response to the bypass gate signal transmitted from the bypass gate line GBL. The seventh transistor T7 may be referred to as a bypass transistor.

A first electrode of the storage capacitor Cst may be connected to the gate electrode of the first transistor T1, and a second electrode of the storage capacitor Cst may receive the driving voltage ELVDD. The storage capacitor Cst may maintain a voltage between the source electrode and the gate electrode of the first transistor T1 when the second transistor T2 is turned off.

The anode electrode of the light emitting element EL may be connected to the pixel circuit PC, and the cathode electrode of the light emitting element EL may receive the common voltage ELVSS. The light emitting element EL may emit light based on the driving current transmitted from the first transistor T1.

Because the planar structure and the cross-sectional structure of the pixel circuit PC are substantially the same as or similar to the planar structure and the cross-sectional structure of the repair pixel circuit RP, respectively, the planar structure and the cross-sectional structure of the pixel circuit PC will be described below with respect to the description of the planar structure and cross-sectional structure of the repair pixel circuit RP.

Figure 6:
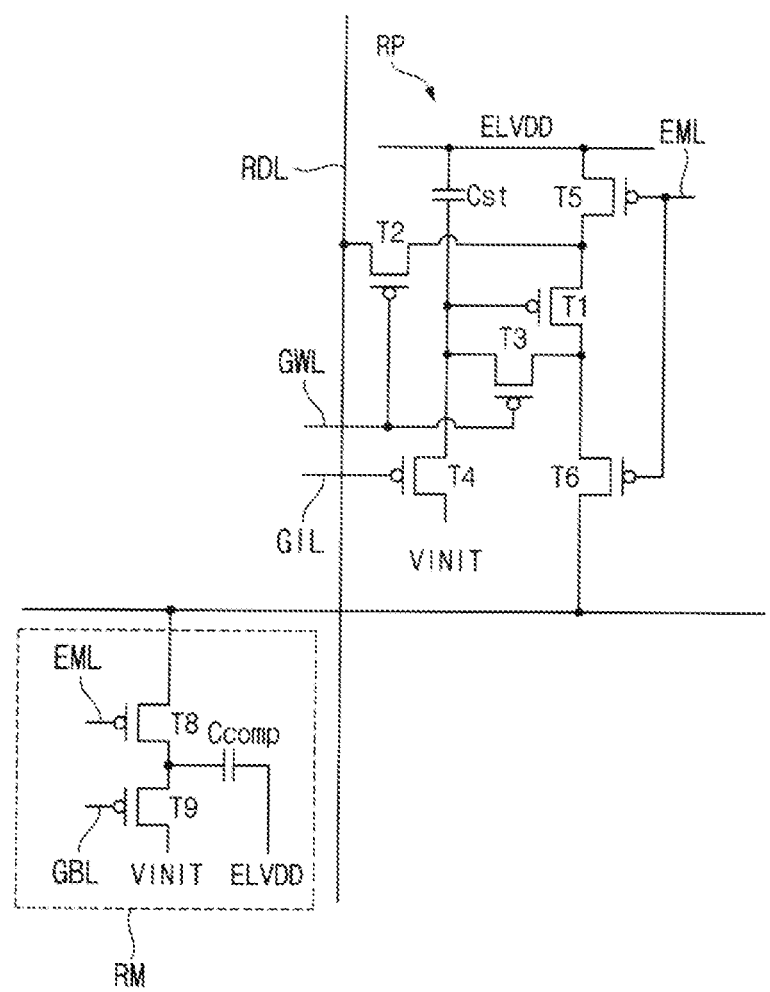
FIG. 6 is a circuit diagram illustrating a repair circuit in FIG. 3.

FIG. 6 is a circuit diagram illustrating the repair circuit RPB in FIG. 3.

Referring to FIG. 6, the repair circuit RPB may include the repair pixel circuit RP and the repair modulation circuit RM.

Because the components of the repair pixel circuit RP are substantially the same as, or similar to, the components of the above-described pixel circuit PC except for the omission of the seventh transistor T7, descriptions of the components of the repair pixel circuit RP will be omitted.

The repair modulation circuit RM may include eighth and ninth transistors T8 and T9 and a compensation capacitor Ccomp. Each of the eighth and ninth transistors T8 and T9 may have a gate electrode, a source electrode, and a drain electrode.

A gate electrode of the eighth transistor T8 may be connected to the emission control line EML. A source electrode of the eighth transistor T8 may be connected to the drain electrode of the sixth transistor T6.

A gate electrode of the ninth transistor T9 may be connected to the bypass gate line GBL. A source electrode of the ninth transistor T9 may be connected to the drain electrode of the eighth transistor T8, and a drain electrode of the ninth transistor T9 may receive the initialization voltage VINIT.

A first electrode of the compensation capacitor Ccomp may be connected to the source electrode of the ninth transistor T9, and a second electrode of the compensation capacitor Ccomp may receive the driving voltage ELVDD.

Figure 7:
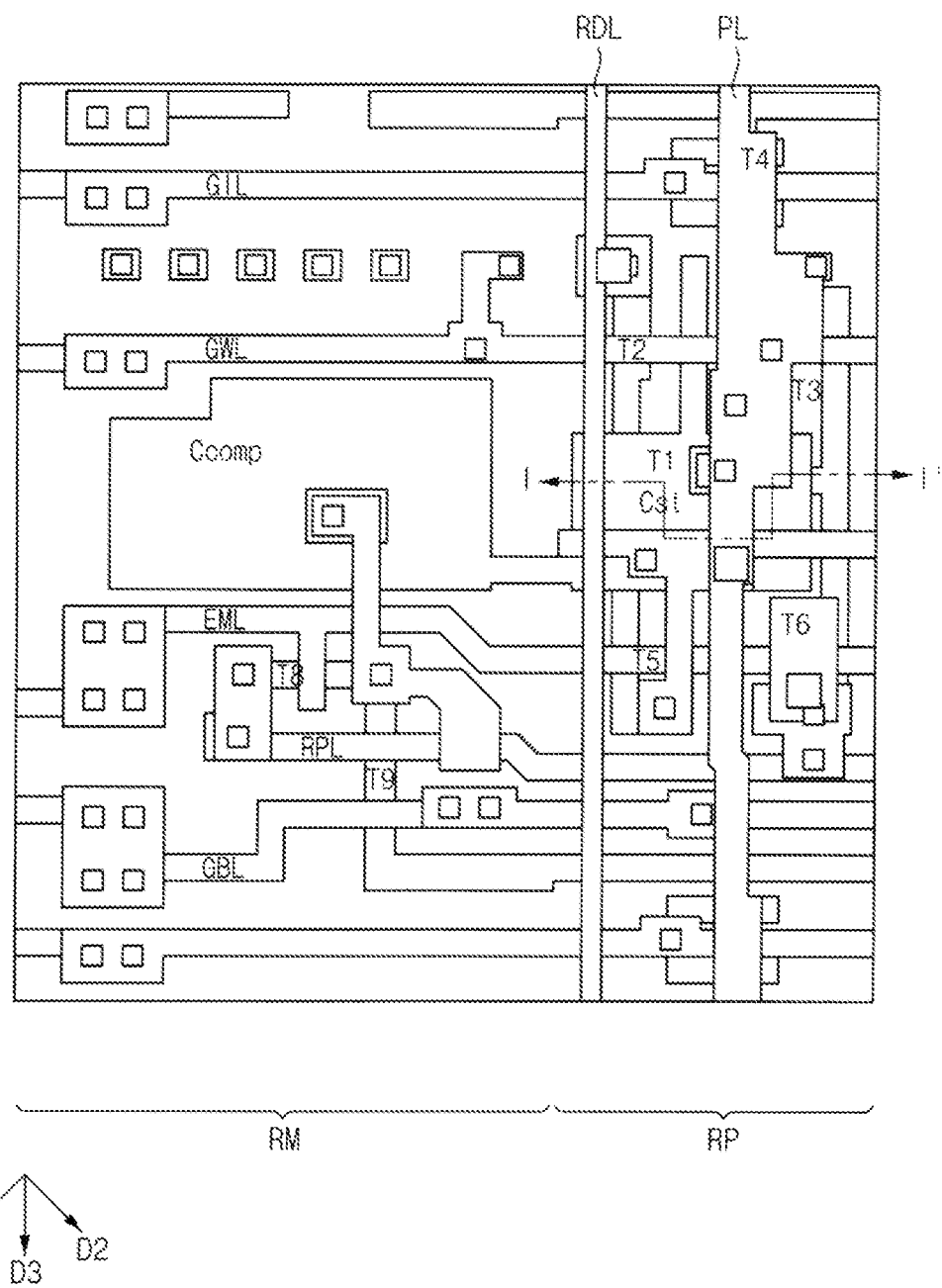
FIG. 7 is a plan view illustrating the repair circuit in FIG. 6.
Figure 8:
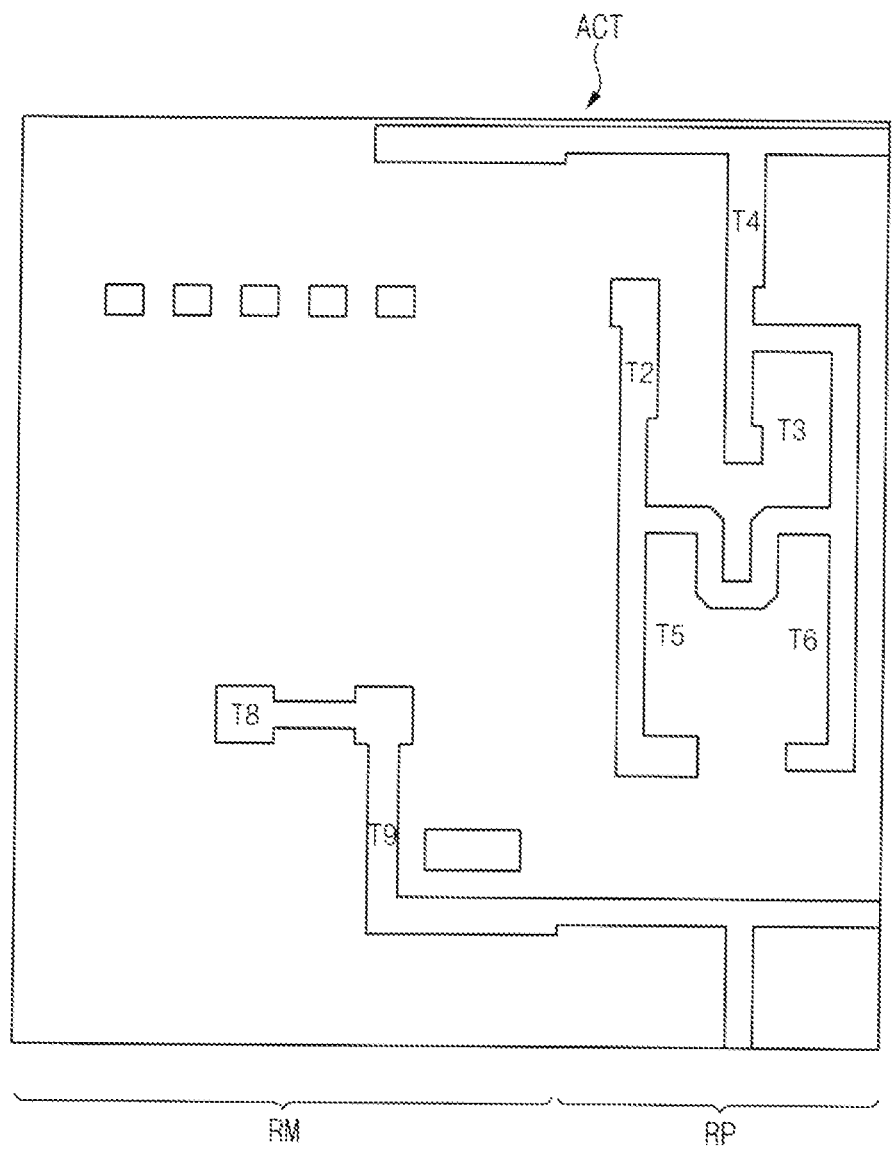
FIG. 8 is a plan view illustrating an active layer in FIG. 7.
Figure 9:
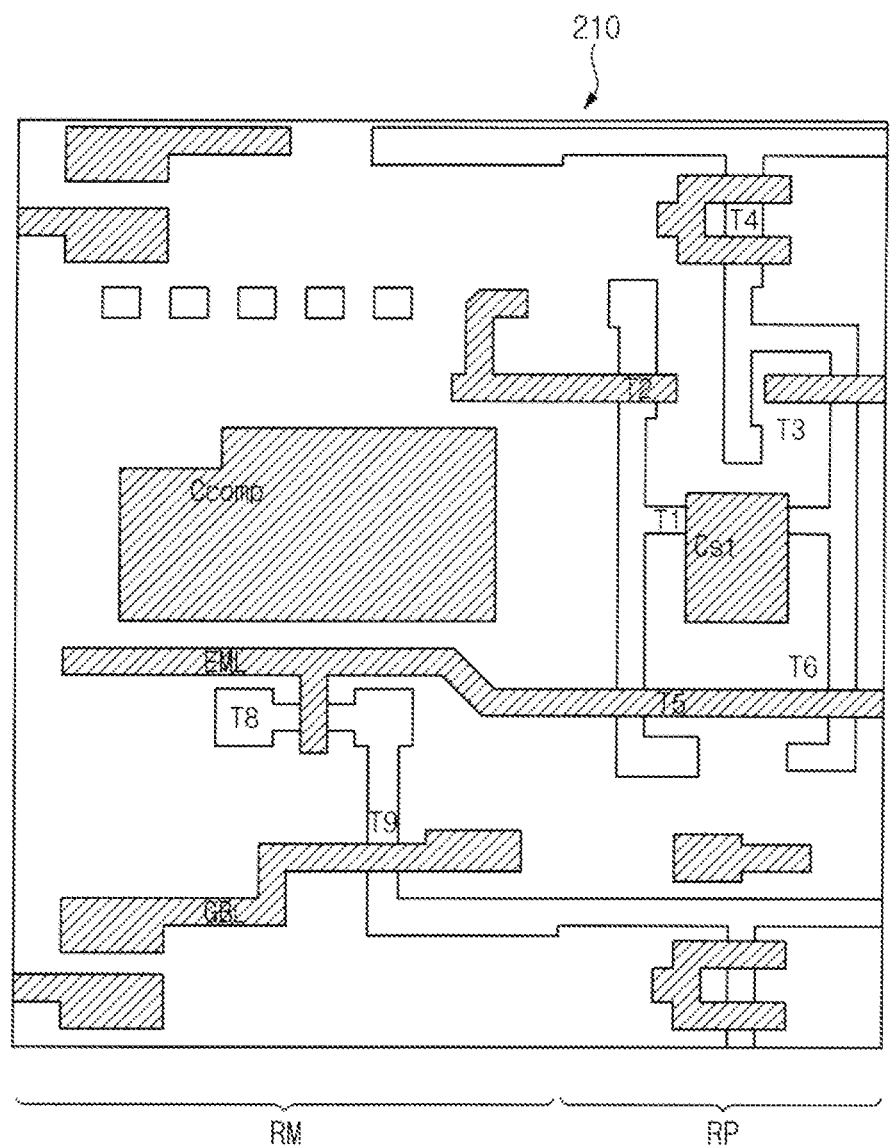
FIG. 9 is a plan view illustrating a first conductive layer in FIG. 7.
Figure 9:
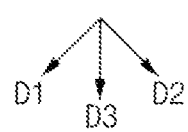
Figure 10:
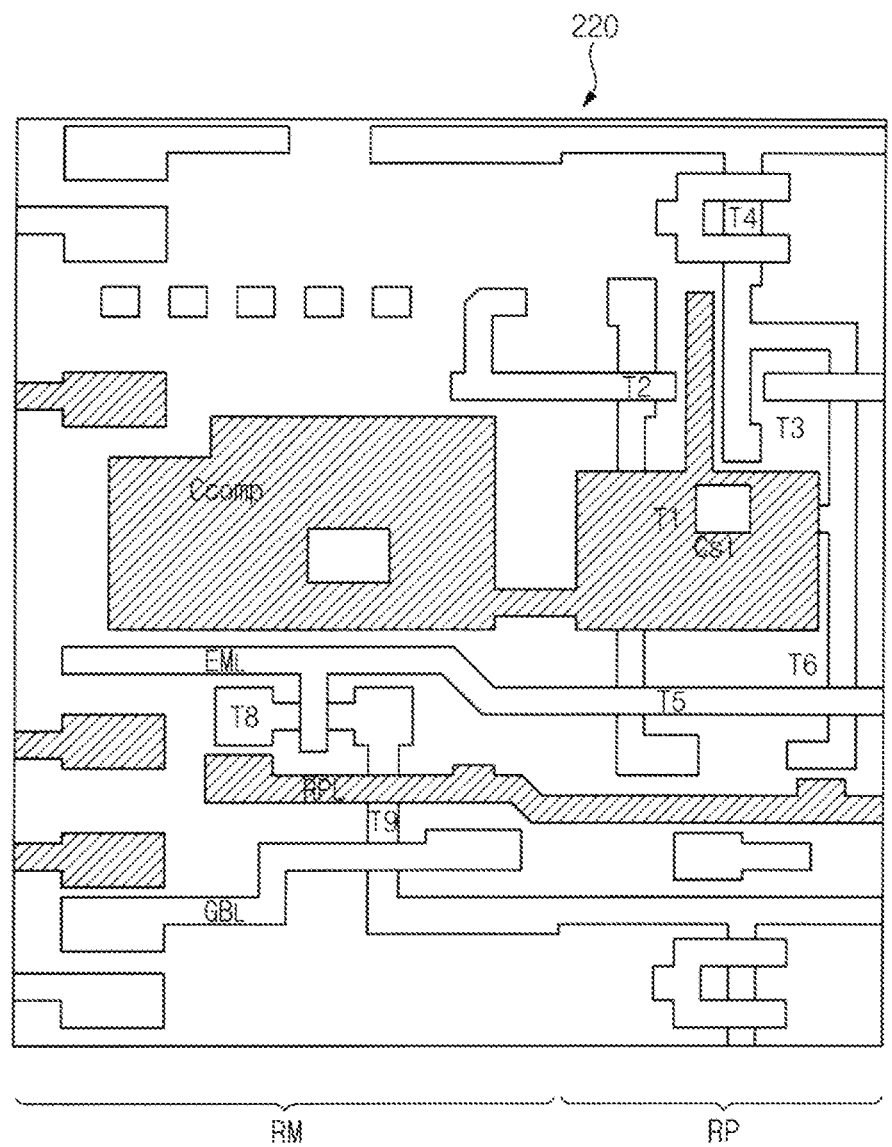
FIG. 10 is a plan view illustrating a second conductive layer in FIG. 7.
Figure 11:
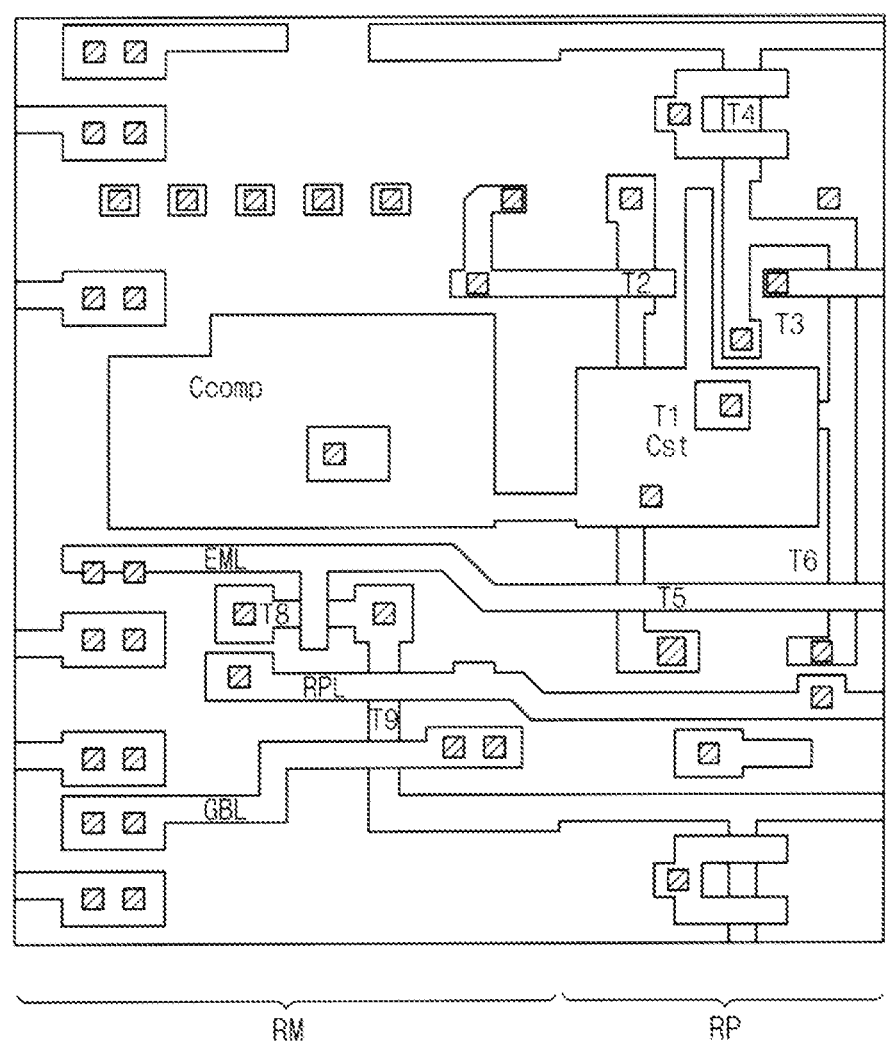
FIG. 11 is a plan view illustrating contact holes in FIG. 7.
Figure 12:
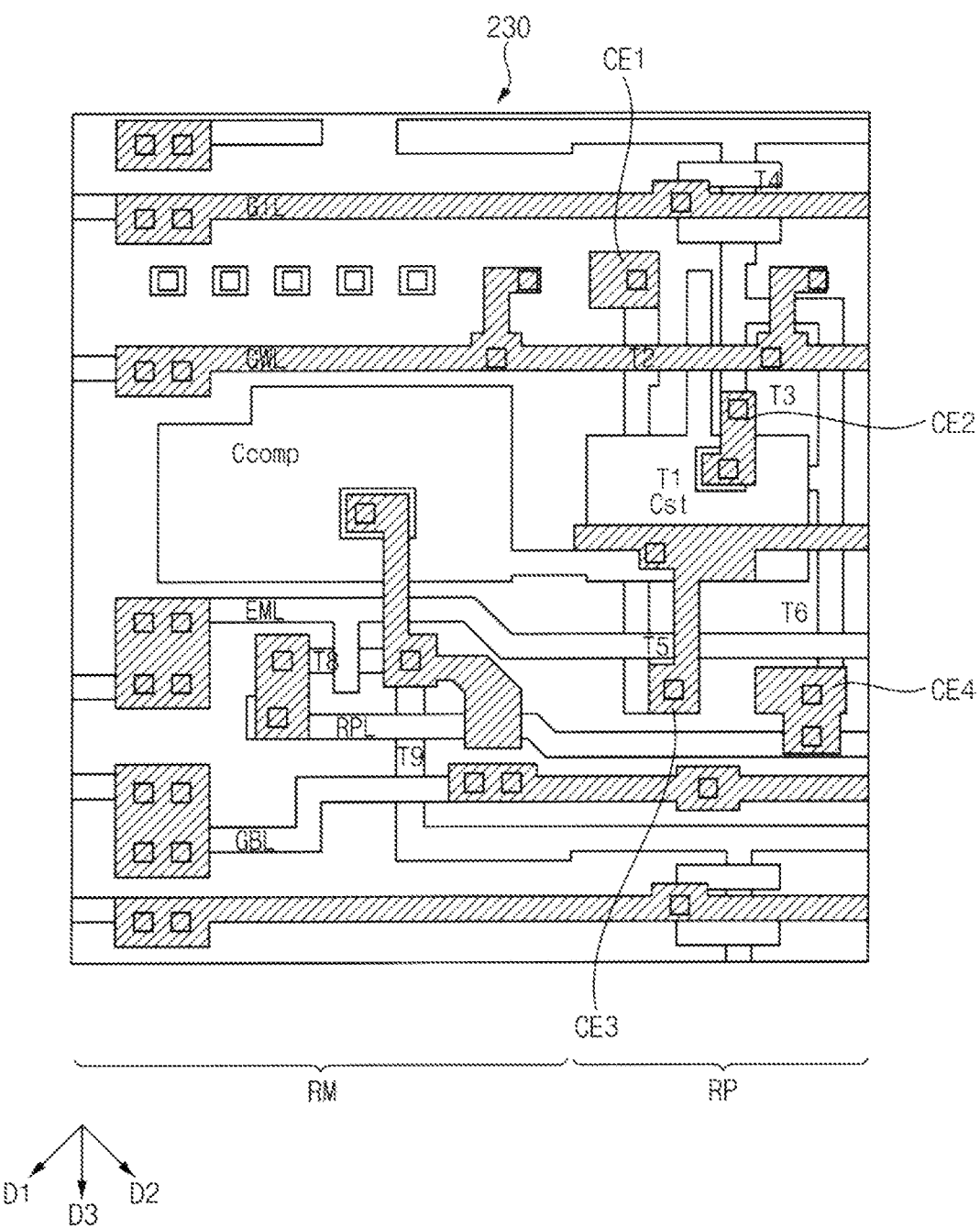
FIG. 12 is a plan view illustrating a third conductive layer in FIG. 7.
Figure 13:
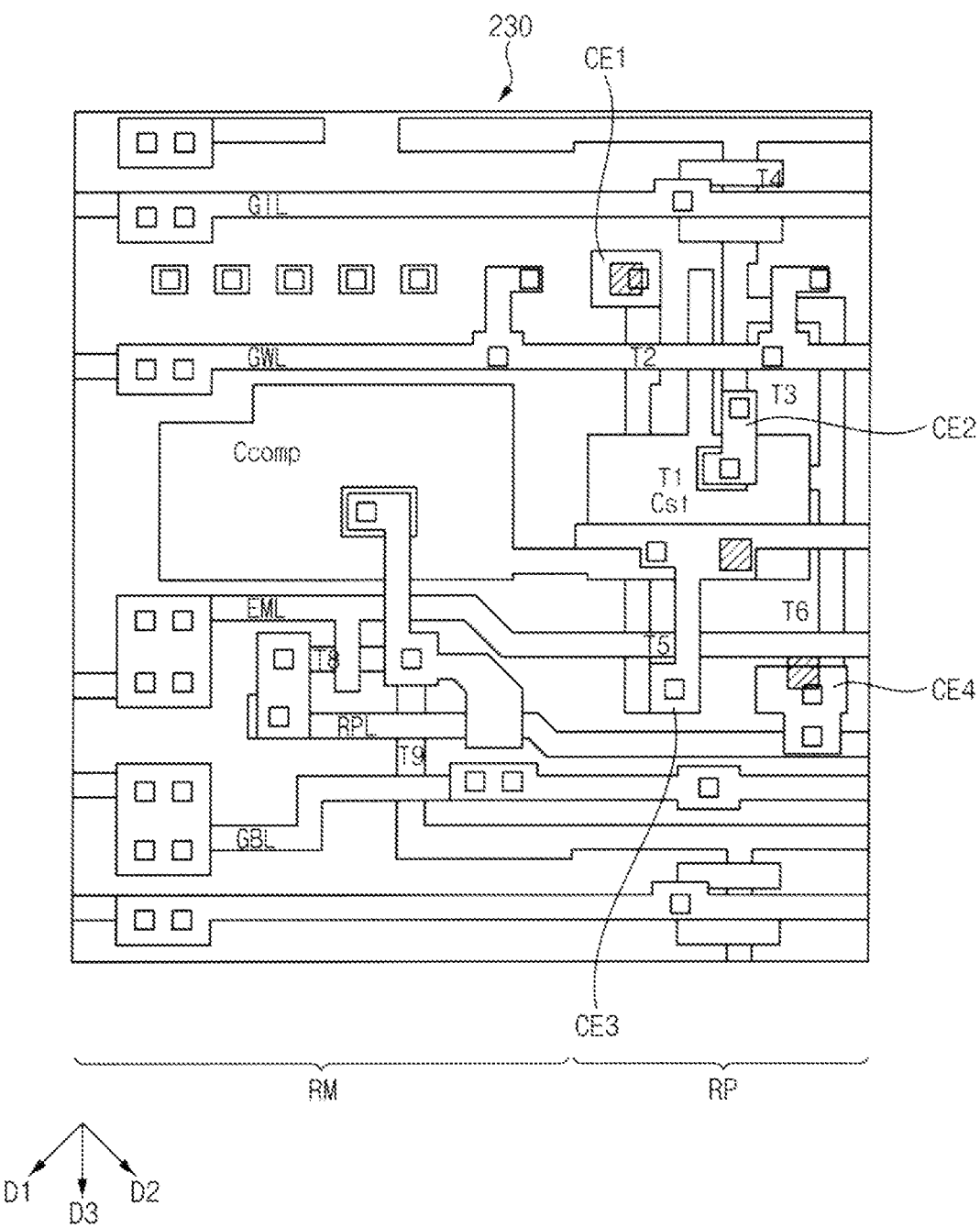
FIG. 13 is a plan view illustrating via holes in FIG. 7.
Figure 14:
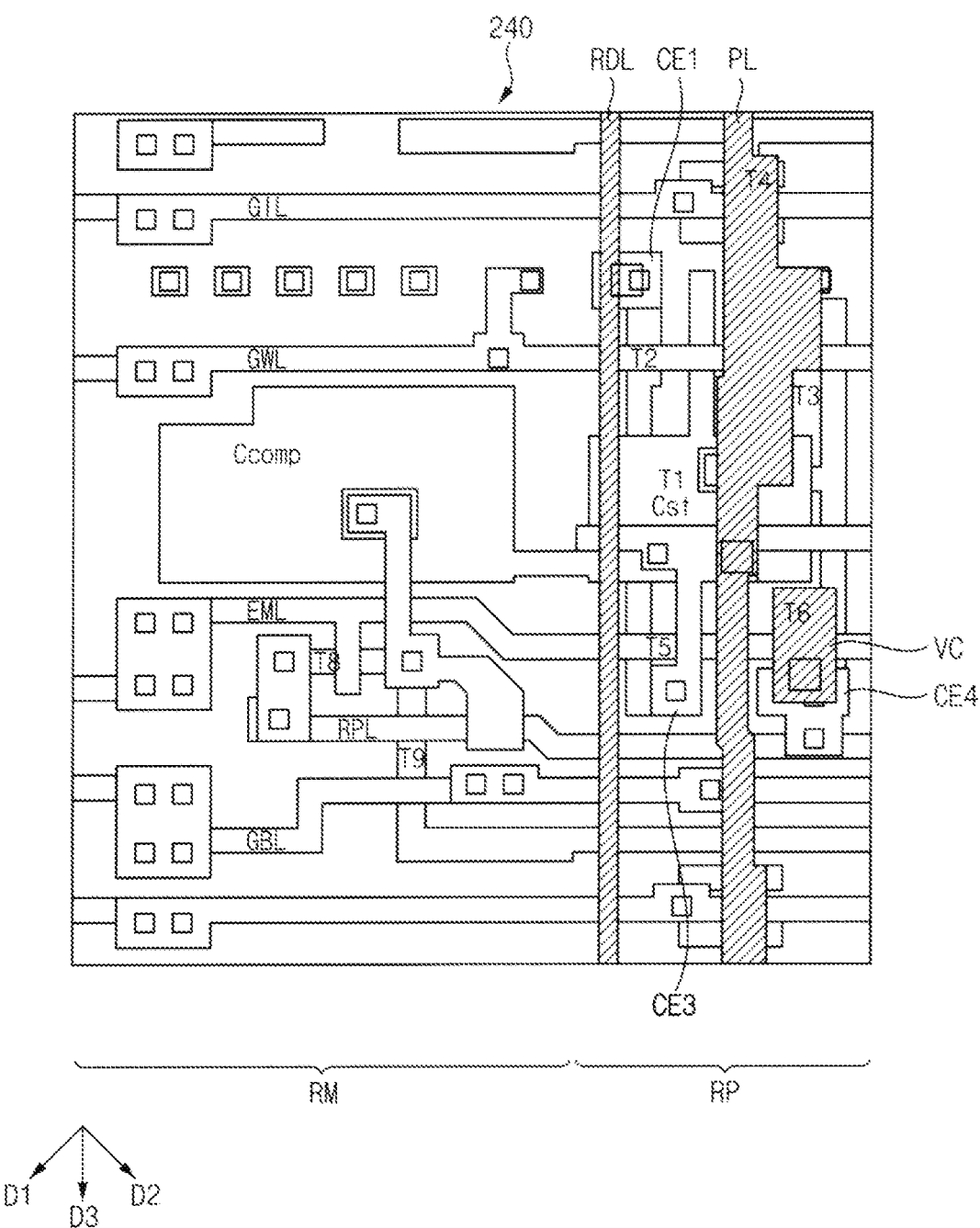
FIG. 14 is a plan view illustrating a fourth conductive layer in FIG. 7.
Figure 15:
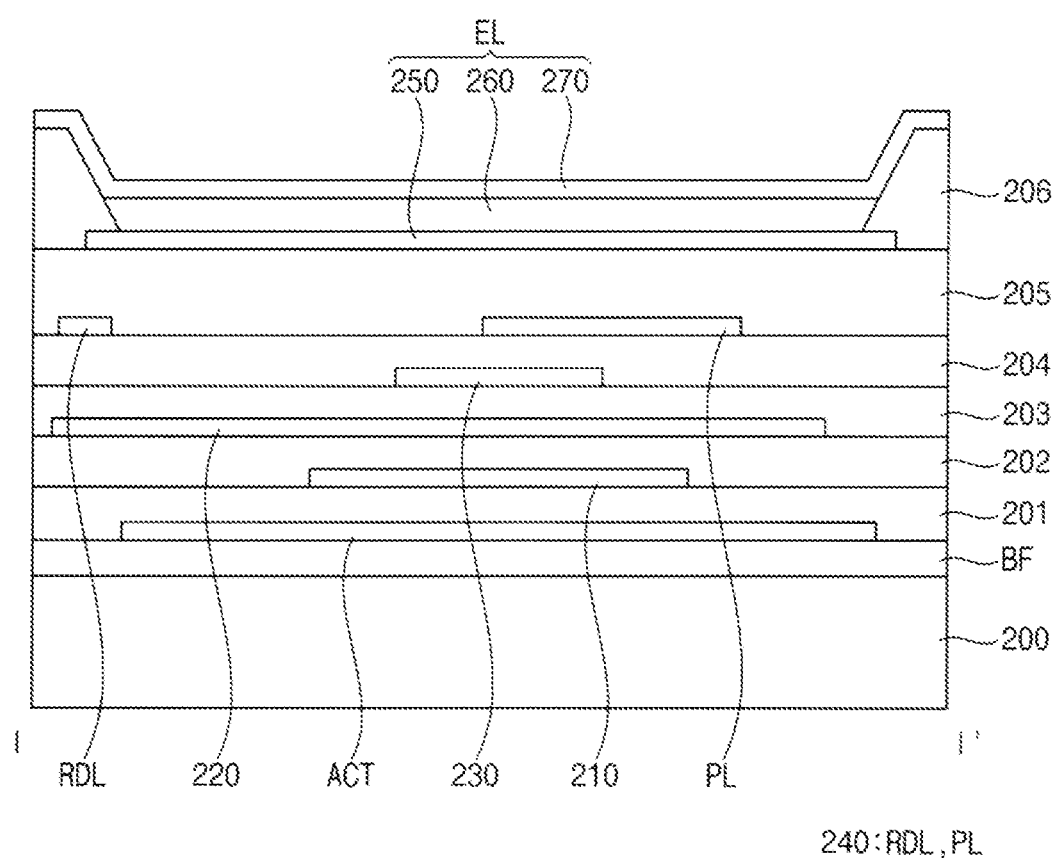
FIG. 15 is a cross-sectional view illustrating the repair circuit taken along the line I-I' in FIG. 7.

FIG. 7 is a plan view illustrating the repair circuit RPB in FIG. 6. FIG. 8 is a plan view illustrating an active layer ACT in FIG. 7. FIG. 9 is a plan view illustrating a first conductive layer 210 in FIG. 7. FIG. 10 is a plan view illustrating a second conductive layer 220 in FIG. 7. FIG. 11 is a plan view illustrating contact holes in FIG. 7. FIG. 12 is a plan view illustrating a third conductive layer 230 in FIG. 7. FIG. 13 is a plan view illustrating via holes in FIG. 7. FIG. 14 is a plan view illustrating a fourth conductive layer 240 in FIG. 7. FIG. 15 is a cross-sectional view illustrating the repair circuit RPB taken along the line I-I' in FIG. 7.

Referring to FIGS. 7, 8, 9, 10, 11, 12, 13, 14, and 15, the display device may include a substrate 200, an active layer ACT, a first conductive layer 210, a second conductive layer 220, a third conductive layer 230, a fourth conductive layer 240, a first electrode 250, an emission layer 260, and a second electrode 270.

The substrate 200 may be an insulating substrate including glass, quartz, plastic, or the like. In some embodiments, the substrate 200 may include a first flexible layer, a first barrier layer located on the first flexible layer, a second flexible layer located on the first barrier layer, and a second barrier layer located on the second flexible layer. The first flexible layer and the second flexible layer may include an organic insulating material such as polyimide (PI), etc., and the first barrier layer and the second barrier layer may include an inorganic insulating material such as silicon oxide, silicon nitride, amorphous silicon, etc.

A buffer layer BF may be located on the substrate 200. The buffer layer BF may include an inorganic insulating material such as silicon oxide, silicon nitride, silicon oxynitride, etc. and/or an organic insulating material such as polyimide (PI), etc.

The active layer ACT may be located on the buffer layer BF. The active layer ACT may include a semiconductor material. In some embodiments, the active layer ACT may include at least one of amorphous silicon and polycrystalline silicon. However, the present disclosure is not limited thereto, and in other embodiments, the active layer ACT may include an oxide semiconductor. The first, second, third, fourth, fifth, sixth, eighth, and ninth transistors T1-T6 and T8-T9 may be formed along the active layer ACT.

A first insulation layer 201 may be located on the active layer ACT. The first insulation layer 201 may cover the active layer ACT on the buffer layer BF. The first insulation layer 201 may include an inorganic insulating material such as silicon oxide, silicon nitride, silicon oxynitride, etc. and/or an organic insulating material such as polyimide (PI), etc.

The first conductive layer 210 may be located on the first insulation layer 201. The first conductive layer 210 may include a conductive material such as molybdenum (Mo), copper (Cu), aluminum (Al), titanium (Ti), etc. The first conductive layer 210 may include the emission control line EML, a first portion of the bypass gate line GBL, the gate electrode of the first transistor T1 (e.g., a first electrode of the storage capacitor Cst), and a first electrode of the compensation capacitor Ccomp.

The gate electrode of the first transistor T1 may form the first transistor T1 together with the active layer ACT. The emission control line EML may form the fifth transistor T5, the sixth transistor T6, and the eighth transistor T8 together with the active layer ACT.

A second insulation layer 202 may be located on the first conductive layer 210. The second insulation layer 202 may cover the first conductive layer 210 on the first insulation layer 201. The second insulation layer 202 may include an inorganic insulating material such as silicon oxide, silicon nitride, silicon oxynitride, etc., and/or an organic insulating material such as polyimide (PI), etc.

The second conductive layer 220 may be located on the second insulation layer 202. The second conductive layer 220 may include a conductive material such as molybdenum (Mo), copper (Cu), aluminum (Al), titanium (Ti), etc. The second conductive layer 220 may include the repair line RPL, a second electrode of the storage capacitor Cst, and a second electrode of the compensation capacitor Ccomp.

In some embodiments, each of the fan-out lines FOL in FIG. 3 may be located at the same layer as one of the first conductive layer 210 and the second conductive layer 220. For example, some of the fan-out lines FOL located at the same layer as the first conductive layer 210 may be alternately arranged with others of the fan-out lines FOL located at the same layer as the second conductive layer 220.

A third insulation layer 203 may be located on the second conductive layer 220. The third insulation layer 203 may cover the second conductive layer 220 on the second insulation layer 202. The third insulation layer 203 may include an inorganic insulating material such as silicon oxide, silicon nitride, silicon oxynitride, etc., and/or an organic insulating material such as polyimide (PI), etc.

Contact holes may be formed in the first insulation layer 201, the second insulation layer 202, and/or the third insulation layer 203. The third conductive layer 230 may be connected to the active layer ACT, the first conductive layer 210, and/or the second conductive layer 220 through the contact holes.

The third conductive layer 230 may be located on the third insulation layer 203. The third conductive layer 230 may include a conductive material such as molybdenum (Mo), copper (Cu), aluminum (Al), titanium (Ti), etc. The third conductive layer 230 may include the write gate line GWL, the initialization gate line GIL, a second portion of the bypass gate line GBL, a first connection electrode CE1, a second connection electrode CE2, a third connection electrode CE3, and a fourth connection electrode CE4.

The write gate line GWL may form the second transistor T2 and the third transistor T3 together with the active layer ACT. The initialization gate line GIL may form the fourth transistor T4 together with the active layer ACT. The bypass gate line GBL may form the seventh transistor T7 and the ninth transistor T9 together with the active layer ACT.

The first connection electrode CE1 may be connected to the active layer ACT through a contact hole. For example, the first connection electrode CE1 may be connected to the source electrode of the second transistor T2.

The second connection electrode CE2 may be connected to the active layer ACT and the second conductive layer 220 through contact holes. For example, the second connection electrode CE2 may connect the gate electrode of the first transistor T1, the drain electrode of the third transistor T3, and the drain electrode of the fourth transistor T4.

The third connection electrode CE3 may be connected to the active layer ACT and the second conductive layer 220 through contact holes. For example, the third connection electrode CE3 may connect the source electrode of the fifth transistor T5 and the second electrode of the storage capacitor Cst.

The fourth connection electrode CE4 may be connected to the active layer ACT and the second conductive layer 220 through contact holes. For example, the fourth connection electrode CE4 may connect the drain electrode of the sixth transistor T6 and the repair line RPL.

In some embodiments, the connection lines CNL in FIG. 3 may be located at the same layer as the third conductive layer 230 in the peripheral area PA in FIG. 3 adjacent to the first corner portion CP1 in FIG. 3. Because each of the fan-out lines FOL is located at the same layer as one of the first conductive layer 210 and the second conductive layer 220, and because the connection lines CNL are located at the same layer as the third conductive layer 230 in the peripheral area PA adjacent to the first corner portion CP1, the connection lines CNL may cross the fan-out lines FOL in the peripheral area PA adjacent to the first corner portion CP1.

A fourth insulation layer 204 may be located on the third conductive layer 230. The fourth insulation layer 204 may cover the third conductive layer 230 on the third insulation layer 203. The fourth insulation layer 204 may include an inorganic insulating material such as silicon oxide, silicon nitride, silicon oxynitride, etc. and/or an organic insulating material such as polyimide (PI), etc.

Via holes may be formed in the fourth insulation layer 204. The fourth conductive layer 240 may be connected to the third conductive layer 230 through the via holes.

The fourth conductive layer 240 may be located on the fourth insulation layer 204. The fourth conductive layer 240 may include a conductive material such as molybdenum (Mo), copper (Cu), aluminum (Al), titanium (Ti), etc. The fourth conductive layer 240 may include the repair data line RDL, the power line PL, and a via contact electrode VC.

The repair data line RDL may be connected to the first connection electrode CE1 through a via hole. Accordingly, the repair data line RDL may be connected to the source electrode of the second transistor T2 through the first connection electrode CE1.

The power line PL may be connected to the third connection electrode CE3 through a via hole. Accordingly, the power line PL may be connected to the source electrode of the fifth transistor T5 and the second electrode of the storage capacitor Cst through the third connection electrode CE3.

The via contact electrode VC may be connected to the fourth connection electrode CE4 through a via hole. Accordingly, the via contact electrode VC may be connected to the drain electrode of the sixth transistor T6 and the repair line RPL through the fourth connection electrode CE4.

In some embodiments, the fourth conductive layer 240 may include the pixel data line PDL in FIG. 5. In other words, the pixel data line PDL and the repair data line RDL may be located at the same layer as the fourth conductive layer 240. However, the present disclosure is not limited thereto, and in other embodiments, the pixel data line PDL and the repair data line RDL may be located at the same layer as the third conductive layer 230.

A fifth insulation layer 205 may be located on the fourth conductive layer 240. The fifth insulation layer 205 may cover the fourth conductive layer 240 on the fourth insulation layer 204. The fifth insulation layer 205 may include an inorganic insulating material such as silicon oxide, silicon nitride, silicon oxynitride, etc. and/or an organic insulating material such as polyimide (PI), etc.

The first electrode 250 may be located on the fifth insulation layer 205. The first electrode 250 may include a conductive material such as a metal, an alloy, a transparent conductive oxide, etc. For example, the first electrode 250 may include silver (Ag), indium tin oxide (ITO), or the like. In some embodiments, the first electrode 250 may have a multi-layered structure including an indium tin oxide layer, a silver layer, and an indium tin oxide layer which are stacked.

A sixth insulation layer 206 may be located on the first electrode 250. The sixth insulation layer 206 may cover the first electrode 250 on the fifth insulation layer 205. The sixth insulation layer 206 may have a pixel opening exposing at least a portion of the first electrode 250. In some embodiments, the pixel opening may expose a central portion of the first electrode 250, and the sixth insulation layer 206 may cover a peripheral portion of the first electrode 250. The sixth insulation layer 206 may include an organic insulating material such as polyimide (PI), etc.

The emission layer 260 may be located on the first electrode 250. The emission layer 260 may be located on the first electrode 250 exposed by the pixel opening. The emission layer 260 may include at least one of an organic light emitting material and a quantum dot.

In some embodiments, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, etc., and the high molecular weight organic compound may include poly(3,4-ethylenedioxythiophene), polyaniline, polyphenylenevinylene, polyfluorene, etc.

In some embodiments, the quantum dot may include a core including a group II-VI compound, a group III-V compound, a group IV-VI compound, a group IV element, a group IV compound, and/or combinations thereof. In some embodiments, the quantum dot may have a core-shell structure including a core and a shell surrounding the core. The shell may serve as a protective layer for maintaining semiconductor properties by preventing chemical modification of the core and as a charging layer for imparting electrophoretic properties to the quantum dot.

The second electrode 270 may be located on the emission layer 260. In some embodiments, the second electrode 270 may also be located on the sixth insulation layer 206. The second electrode 270 may include a conductive material such as a metal, an alloy, a transparent conductive oxide, etc. For example, the second electrode 270 may include aluminum (Al), platinum (Pt), silver (Ag), magnesium (Mg), gold (Au), chromium (Cr), tungsten (W), titanium (Ti), etc. The first electrode 250, the emission layer 260, and the second electrode 270 may form the light emitting element EL.

Figure 16:
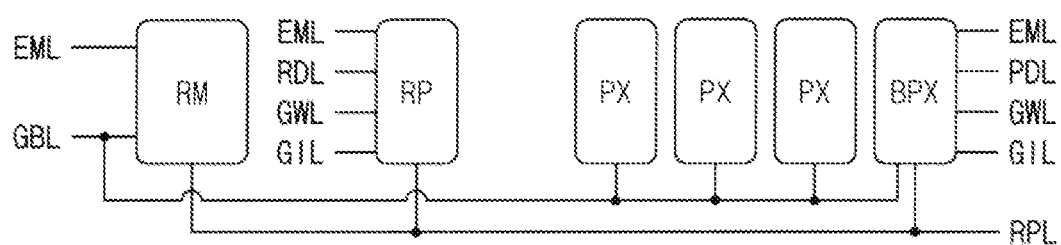
FIG. 16 is a block diagram illustrating a repair pixel circuit, a repair modulation circuit, and pixels according to some embodiments.

FIG. 16 is a block diagram illustrating the repair pixel circuit RP, the repair modulation circuit RM, and pixels PX and BPX (including defective pixel BPX) according to some embodiments. For example, FIG. 16 may illustrate a repair pixel circuit RP, a repair modulation circuit RM, and pixels PX and BPX included in a pixel row corresponding thereto.

Referring to FIG. 16, the repair pixel circuit RP and the repair modulation circuit RM may be connected to the repair line RPL, and the repair line RPL may cross the pixels PX and BPX included in one pixel row. The repair pixel circuit RP may be connected to the repair data line RDL, the write gate line GWL, the initialization gate line GIL, and the emission control line EML, and the repair modulation circuit RM may be connected to the bypass gate line GBL and the emission control line EML. The pixel circuit of each of the pixels PX and BPX may be connected to the pixel data line PDL, the write gate line GWL, the initialization gate line GIL, the bypass gate line GBL, and the emission control line EML.

When a defect occurs in the pixel circuit of any one of the pixels PX, a line between the light emitting element and the pixel circuit of a defective pixel BPX may be disconnected, and the light emitting element of the defective pixel BPX may be connected to the repair line RPL. Then, the data signal supplied to the pixel data line PDL of the defective pixel BPX may be transmitted to the repair data line RDL. Accordingly, a driving current transmitted from the repair pixel circuit RP may be transmitted to the light emitting element of the defective pixel BPX through the repair line RPL, and the light emitting element of the defective pixel BPX may normally emit light.

Figure 17:
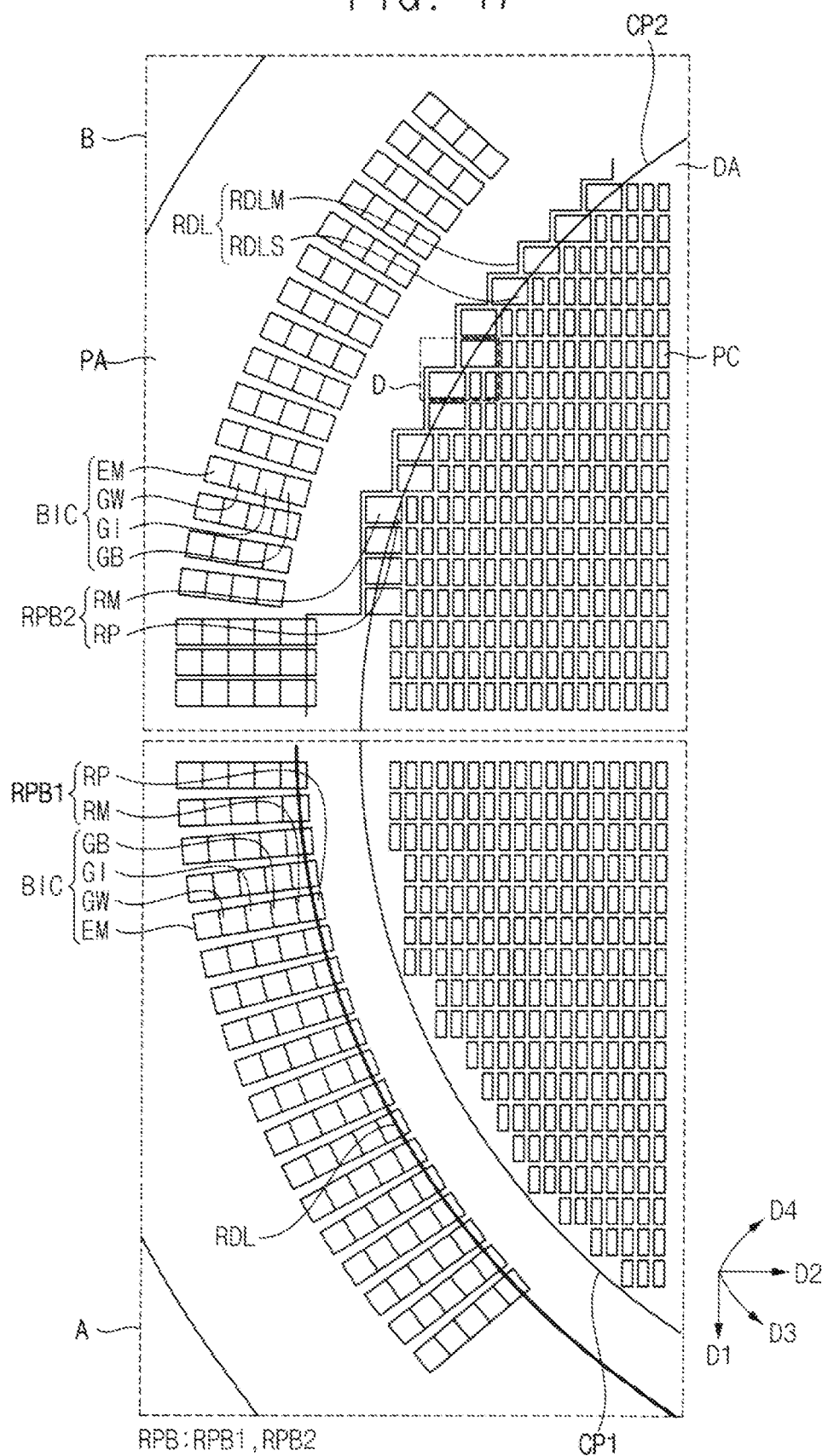
FIG. 17 is a plan view illustrating other embodiments of the area A and the area B in FIG. 1.
Figure 18:
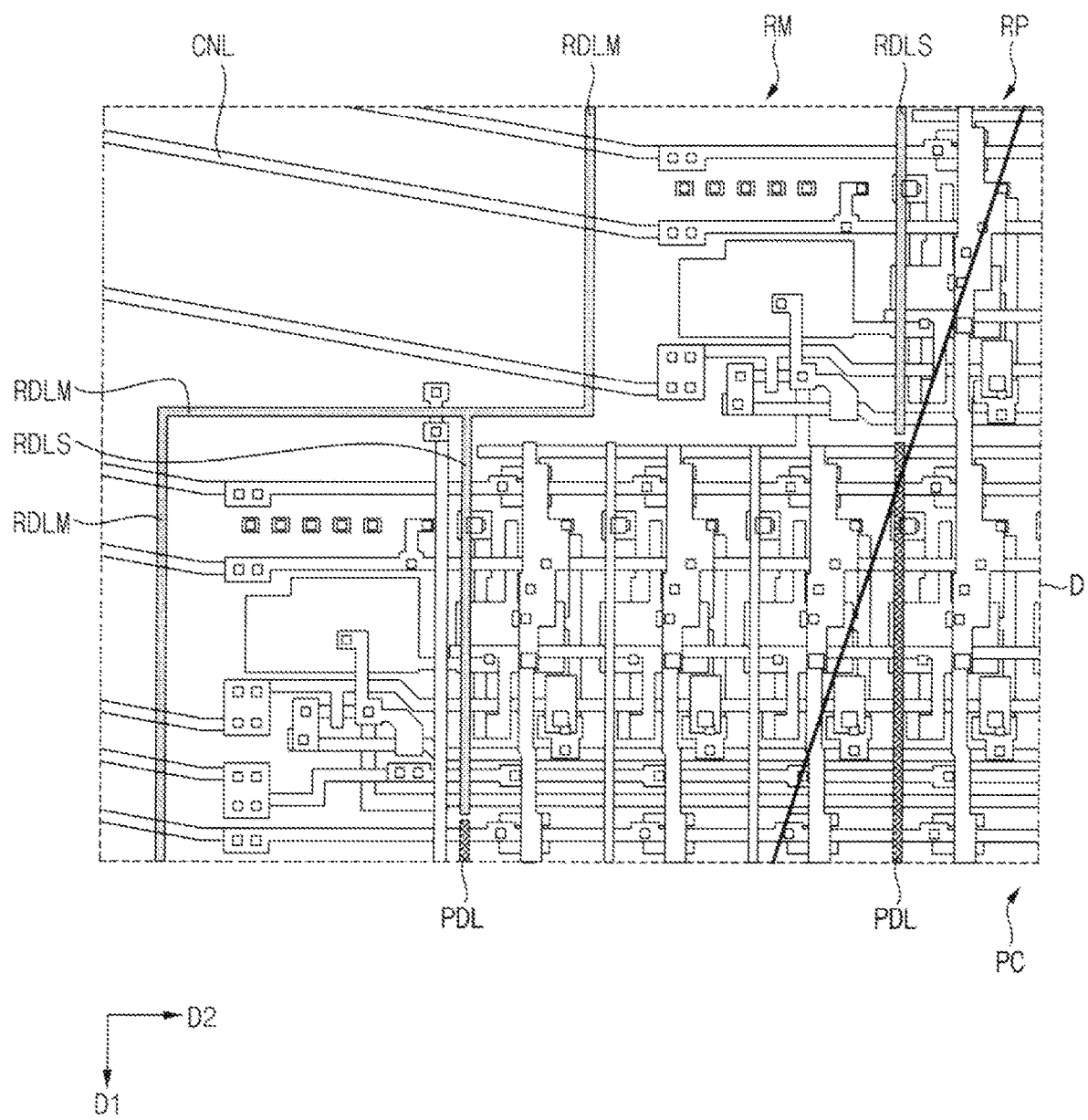
FIG. 18 is a plan view illustrating an area D in FIG. 17.

FIG. 17 is a plan view illustrating other embodiments of the area A and the area B in FIG. 1. For example, the area A may illustrate the display area DA and the peripheral area PA that are adjacent to the first corner portion CP1, and the area B may illustrate the display area DA and the peripheral area PA that are adjacent to the second corner portion CP2. FIG. 18 is a plan view illustrating an area D in FIG. 17.

Referring to FIGS. 1, 17, and 18, a display device may include pixel circuits PC, scan driving circuits BIC, fan-out lines FOL (as shown in FIG. 3), connection lines CNL, repair circuits RPB, pixel data lines PDL, and a repair data line RDL. Descriptions of components of the display device described with reference to FIGS. 1, 17, and 18 that are substantially the same as or similar to those of the display device described with reference to FIGS. 1, 2, and 3 will not be repeated.

The fan-out lines FOL might not be located in the peripheral area PA adjacent to the second corner portion CP2. Accordingly, the connection lines CNL might not cross the fan-out lines FOL in the peripheral area PA adjacent to the second corner portion CP2. Accordingly, in some embodiments, the connection lines CNL may be located at the same layer as the fan-out lines FOL in the peripheral area PA adjacent to the second corner portion CP2. For example, each of the connection lines CNL may be located at the same layer as one of the first conductive layer 210 in FIG. 15 and the second conductive layer 220 in FIG. 15. However, the present disclosure is not limited thereto, and in other embodiments, the connection lines CNL may be located at a different layer from the fan-out lines FOL in the peripheral area PA adjacent to the second corner portion CP2. For example, each of the connection lines CNL may be located at the same layer as one of the third conductive layer 230 in FIG. 15 and the fourth conductive layer 240 in FIG. 15.

The second repair circuits RPB2 may be adjacent to the pixel circuits PC, and may be spaced apart from the scan driving circuits BIC. In other words, an interval between the second repair circuits RPB2 and the scan driving circuits BIC may be greater than an interval between the second repair circuits RPB2 and the pixel circuits PC. The second repair circuits RPB2 may be arranged in a stepped shape which extends in the first direction D1 and the second direction DR2 along the pixel circuits PC located in the display area DA adjacent to the second corner portion CP2.

The repair data line RDL may have a curved shape in the peripheral area PA adjacent to the first corner portion CP1, and may have a step shape extending in the first direction D1 and the second direction D2 in the peripheral area PA adjacent to the second corner portion CP2.

The repair data line RDL may include branch repair data lines RDLS extending to cross the second repair circuits RPB2 in the peripheral area PA adjacent to the second corner portion CP2. For example, the repair data line RDL located in the peripheral area PA adjacent to the second corner portion CP2 may include a main repair data line RDLM and the branch repair data lines RDLS.

The main repair data line RDLM may surround (e.g., partially surround) the second repair circuits RPB2. The branch repair data lines RDLS may branch from the main repair data line RDLM, and may extend to cross the second repair circuits RPB2. The branch repair data lines RDLS may be located on the same lines as the pixel data lines PDL, and may be spaced apart from the pixel data lines PDL. Accordingly, the repair data lines RDL might not be electrically connected to the pixel data lines PDL.

The display device according to some embodiments may be applied to a display device included in a computer, a notebook, a mobile phone, a smart phone, a smart pad, a PMP, a PDA, an MP3 player, or the like.

Although the display devices according to some embodiments have been described with reference to the drawings, the illustrated embodiments are examples, and may be modified and changed by a person having ordinary knowledge in the relevant technical field without departing from the technical spirit described in the following claims, with functional equivalents thereof to be included therein.

What is claimed is:

1. A display device, comprising:
   a pixel circuit in a display area comprising a rounded corner portion;
   a scan driving circuit in a peripheral area surrounding the display area, and configured to provide a scan signal to the pixel circuit;
   a fan-out line between the pixel circuit and the scan driving circuit in the peripheral area adjacent to the corner portion, and configured to provide a pixel data signal to the pixel circuit; and
   a repair circuit between the scan driving circuit and the fan-out line in the peripheral area adjacent to the corner portion.

2. The display device of claim 1, wherein the pixel circuit comprises:
   an active layer;
   a first conductive layer above the active layer;
   a second conductive layer above the first conductive layer;
   a third conductive layer above the second conductive layer; and
   a fourth conductive layer above the third conductive layer.

3. The display device of claim 2, further comprising:
   a pixel data line in the display area, connected to the fan-out line, and configured to provide the pixel data signal to the pixel circuit; and
   a repair data line in the peripheral area, and configured to provide a repair data signal to the repair circuit.

4. The display device of claim 3, wherein the repair data line is at a same layer as the pixel data line.

5. The display device of claim 4, wherein the pixel data line and the repair data line are at a same layer as the fourth conductive layer.

6. The display device of claim 3, wherein the repair data line has a curved shape in the peripheral area adjacent to the corner portion.

7. The display device of claim 2, further comprising a connection line connecting the scan driving circuit and the pixel circuit, and configured to provide the scan signal to the pixel circuit.

8. The display device of claim 7, wherein the connection line crosses the fan-out line, and is at a different layer from the fan-out line in the peripheral area adjacent to the corner portion.

9. The display device of claim 7, wherein the connection line is at a same layer as the third conductive layer.

10. The display device of claim 2, wherein the fan-out line is at a same layer as one of the first conductive layer and the second conductive layer.

11. A display device, comprising:
    pixel circuits in a display area comprising a rounded first corner portion and a rounded second corner portion, the pixel circuits being arranged in a first direction, and in a second direction that is substantially perpendicular to the first direction;
    scan driving circuits in a peripheral area surrounding the display area, and configured to provide scan signals to the pixel circuits;
    first repair circuits adjacent to the scan driving circuits in the peripheral area adjacent to the first corner portion, the first repair circuits being arranged in a third direction that is between the first direction and the second direction;
    second repair circuits in the peripheral area adjacent to the second corner portion;
    pixel data lines in the display area, and configured to provide pixel data signals to the pixel circuits; and
    a repair data line in the peripheral area, and configured to provide a repair data signal to the first repair circuits and the second repair circuits.

12. The display device of claim 11, wherein the second repair circuits are adjacent to the scan driving circuits and spaced apart from the pixel circuits.

13. The display device of claim 12, wherein the repair data line has a curved shape in the peripheral area adjacent to the first corner portion and the second corner portion.

14. The display device of claim 11, wherein the second repair circuits are adjacent to the pixel circuits and spaced apart from the scan driving circuits.

15. The display device of claim 14, wherein the repair data line has a curved shape in the peripheral area adjacent to the first corner portion, and has a stepped shape extending in the first direction and in the second direction in the peripheral area adjacent to the second corner portion.

16. The display device of claim 15, wherein the repair data line comprises branch repair data lines crossing the second repair circuits in the peripheral area adjacent to the second corner portion, and
    wherein the branch repair data lines are at a same lines as the pixel data lines and spaced apart from the pixel data lines.

17. The display device of claim 11, further comprising fan-out lines between the pixel circuits and the scan driving circuits in the peripheral area adjacent to the first corner portion, the fan-out lines being respectively connected to the pixel data lines.

18. The display device of claim 17, wherein the first repair circuits are between the scan driving circuits and the fan-out lines.

19. The display device of claim 17, further comprising connection lines connecting the scan driving circuits and the pixel circuits, and configured to provide the scan signals to the pixel circuits.

20. The display device of claim 19, wherein the connection lines cross the fan-out lines and are at a different layer from the fan-out lines in the peripheral area adjacent to the first corner portion.

21. The display device of claim 19, wherein the connection lines are at a same layer as the fan-out lines in the peripheral area adjacent to the second corner portion.

* * * * *